(12) United States Patent
Ma (10) Patent No.: US 9,349,759 B2
(45) Date of Patent: May 24, 2016

(54) MANUFACTURING METHOD OF LOW TEMPERATURE POLY-SILICON TFT ARRAY SUBSTRATE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/495,039

(22) Filed: Sep. 24, 2014

(65) Prior Publication Data

US 2015/0011055 A1 Jan. 8, 2015

Related U.S. Application Data

(62) Division of application No. 13/481,002, filed on May 25, 2012, now Pat. No. 8,883,572.

(30) Foreign Application Priority Data

May 27, 2011 (CN) .......................... 2011 1 0140282
May 27, 2011 (CN) .......................... 2011 1 0141242

(51) Int. Cl.
| | |
|---|---|
| *H01L 29/786* | (2006.01) |
| *H01L 27/12* | (2006.01) |
| *H01L 21/66* | (2006.01) |
| *H01L 29/417* | (2006.01) |
| *H01L 29/423* | (2006.01) |
| *H01L 29/66* | (2006.01) |

(52) U.S. Cl.
CPC ............ *H01L 27/1288* (2013.01); *H01L 22/32* (2013.01); *H01L 27/1274* (2013.01); *H01L 29/41733* (2013.01); *H01L 29/42384* (2013.01); *H01L 29/66757* (2013.01)

(58) Field of Classification Search
CPC .......................... H01L 29/786; H01L 29/78651
See application file for complete search history.

(56) References Cited

U.S. PATENT DOCUMENTS

| 8,816,349 B2 * | 8/2014 | Yamazaki et al. .............. 257/72 |
| 2007/0153151 A1 | 7/2007 | Yang |
| 2008/0142797 A1 * | 6/2008 | Lee et al. ........................ 257/43 |

(Continued)

FOREIGN PATENT DOCUMENTS

| CN | 1343900 A | 4/2002 |
| CN | 1536620 A | 10/2004 |

(Continued)

OTHER PUBLICATIONS

First Chinese Office Action dated Apr. 11, 2014; Appln. No. 201110141242.9.

(Continued)

*Primary Examiner* — Jae Lee
(74) *Attorney, Agent, or Firm* — Ladas & Parry LLP (57) ABSTRACT

A manufacturing method of an LTPS-TFT array substrate is provided. The exemplary method comprises a step of sequentially forming a poly-silicon layer and a data-line-metal layer on a base substrate, and performing a patterning process by using a third mask to simultaneously form an active layer and source and drain electrodes, the active layer being provided on the gate insulating layer and corresponding to the gate electrode, and the source and drain electrodes being provided on the active layer.

6 Claims, 4 Drawing Sheets

(56) References Cited

U.S. PATENT DOCUMENTS

| | | | |
|---|---|---|---|
| 2009/0152556 A1* | 6/2009 | Lee | G02F 1/13458 257/59 |
| 2009/0321739 A1* | 12/2009 | Kim et al. | 257/59 |
| 2010/0012945 A1 | 1/2010 | Zheng et al. | |
| 2010/0301327 A1 | 12/2010 | Kang et al. | |
| 2011/0127520 A1 | 6/2011 | You | |

FOREIGN PATENT DOCUMENTS

| | | |
|---|---|---|
| CN | 1991544 A | 7/2007 |
| CN | 101630640 A | 1/2010 |
| CN | 101770122 A | 7/2010 |
| CN | 101907807 A | 12/2010 |
| CN | 101957525 A | 1/2011 |

OTHER PUBLICATIONS

First Chinese Office Action dated May 26, 2014; Appln. No. 201110140282.1.

USPTO RR dated Nov. 15, 2013 in connection with U.S. Appl. No. 13/481,002.

USPTO NFOA dated Mar. 7, 2014 in connection with U.S. Appl. No. 13/481,002.

USPTO NOA mailed Aug. 13, 2014 in connection with U.S. Appl. No. 13/481,002.

Second Chinese Office Action Appln. No. 201110141242.9; Dated Nov. 26, 2014.

* cited by examiner

MANUFACTURING METHOD OF LOW TEMPERATURE POLY-SILICON TFT ARRAY SUBSTRATE

BACKGROUND

Embodiments of the present disclosure relate to a low temperature poly-silicon thin film transistor (LTPS-TFT) array substrate and a manufacturing method thereof.

Applications of amorphous silicon (a-Si) are limited due to a number of defects or shortcomings. For example, such defects or shortcoming in a-Si TFT may cause lower turn-on (ON) current, lower mobility and lower stability. In order to overcome the defects or shortcomings of a-Si and enlarge the application field, more and more attentions have been paid to low temperature poly-silicon (LTPS) recently.

Figure 1:
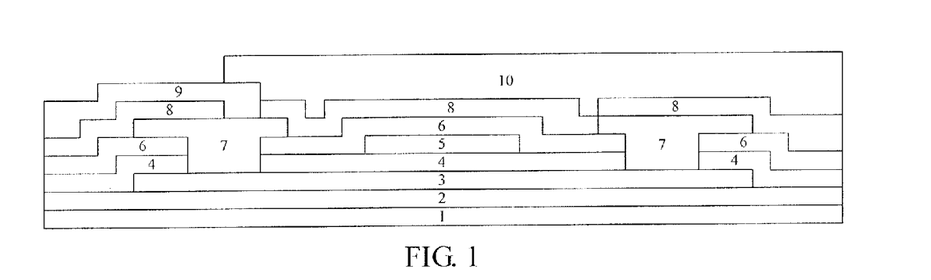
FIG. 1 is a structural schematic view showing a conventional LTPS-TFT array substrate.

FIG. 1 is a structural schematic view showing a conventional LTPS-TFT array substrate. As shown in FIG. 1, the LTPS-TFT array substrate comprises: a base substrate 1 and a buffer layer 2, an active layer 3, a gate insulating layer 4, a gate electrode 5, a first insulating layer 6, source and drain electrodes 7, a second insulating layer 8, a pixel electrode 9 and a protection layer 10 formed on the base substrate. In order to manufacture this LTPS-TFT array substrate, the following seven patterning processes are performed by using seven masks for photolithography.

1. Forming the pattern of the active layer 3 by a first patterning process with a first mask;
2. Forming the pattern of the gate electrode 5 by a second patterning process with a second mask;
3. Forming via holes for connecting the source and drain electrodes 7 with the active layer 3 by a third patterning process with a third mask;
4. Forming the pattern of the source and drain electrodes 7 by a fourth patterning process with a fourth mask;
5. Forming a connection via hole for connecting the pixel electrode 9 with one of the source and drain electrodes by a fifth patterning process with a fifth mask;
6. Forming the pattern of the pixel electrode 9 by a sixth patterning process with a sixth mask; and
7. Forming the protection layer 10 by a seventh patterning process with a seventh mask, wherein the protection layer 10 may be formed of resin for example and used as a planarization layer in the case where an organic light emitting diode (OLED) is provided on the array substrate.

It can be seen that the manufacturing process of the conventional LTPS-TFT array substrate is complicated and the manufacture cost thereof is high. Thus, it is still difficult for the LTPS-TFT products to compete with the a-Si TFT products.

SUMMARY

According to an embodiment, the manufacturing method of a low temperature poly-silicon thin film transistor (LTPS-TFT) array substrate comprises: sequentially forming a poly-silicon layer and a data-line-metal layer on a base substrate, and performing a patterning process by using a first mask to simultaneously form an active layer and source and drain electrodes, the active layer being provided on the base substrate and the source and drain electrodes being provided on the active layer.

According to another embodiment of the disclosure, a manufacturing method of a low temperature poly-silicon thin film transistor (LTPS-TFT) array substrate is provided. The method comprises: Step 1 of sequentially forming a poly-silicon layer and a data-line-metal layer on a base substrate, and performing a patterning process by using a first mask to simultaneously form an active layer and source and drain electrodes, the active layer being provided on the base substrate and the source and drain electrodes being provided on the active layer; Step 2 of depositing a gate insulating layer on the base substrate after Step 1, and performing a patterning process by using a second mask to form a first contact hole in the gate insulating layer to expose one of the source and drain electrodes; Step 3 of depositing a gate-metal-layer on the base substrate after Step 2, and performing a patterning process by using a third mask to form a gate electrode, the gate electrode being provided on the gate insulating layer and corresponding to the active layer; and Step 4 of depositing a transparent conductive layer on the base substrate after Step 3, and performing a patterning process by using a fourth mask to form a pixel electrode, the pixel electrode being provided above the one of the source and drain electrodes and connected with the one of the source and drain electrodes through the first contact hole.

According to further another embodiment of the disclosure, a manufacturing method of an LTPS-TFT array substrate is provided. The method comprises: Step 1 of depositing a gate-metal-layer on a base substrate, and performing a patterning process by using a first mask to form a gate electrode; Step 2 of depositing a gate insulating layer on the base substrate after Step 1, the gate insulating layer covering the base substrate and the gate electrode; Step 3 of sequentially forming a poly-silicon layer and a data-line-metal layer on the base substrate after Step 2, and performing a patterning process by using a third mask to simultaneously form an active layer and source and drain electrodes, the active layer being provided on the gate insulating layer and corresponding to the gate electrode, and the source and drain electrodes being provided on the active layer; and Step 4 of depositing a transparent conductive layer on the base substrate after Step 3, and performing a patterning process by using a fourth mask to form a pixel electrode, the pixel electrode being provided on the source and drain electrodes and the gate insulating layer.

According to still another embodiment of the disclosure, an LTPS-TFT array substrate is provided. The array substrate comprises: a base substrate; an active layer, provided on the base substrate and formed of poly-silicon; source and drain electrodes, provided on the active layer; a gate insulating layer, provided on the base substrate, the active layer and the source and drain electrodes, and having a first contact hole to expose one of the source and drain electrodes; a gate electrode, provided on the gate insulating layer; a pixel electrode, provided above the drain electrode and connected with the one of the source and drain electrodes through the first contact hole; and a protection layer, provided on the gate insulating layer, the gate electrode and a portion of the pixel electrode. The active layer and the conductive structure provided thereon are formed in a same patterning process by using a half-tone or gray-tone mask.

According to further still another embodiment of the disclosure, an LTPS-TFT array substrate is provided. The array substrate comprises: a base substrate; a gate electrode, provided on the base substrate; a gate insulating layer, provided on the base substrate and the gate electrode; an active layer, provided on the gate insulating layer and corresponding to the gate electrode and formed of poly-silicon; source and drain electrodes, provided on the active layer; a pixel electrode, provided on the drain electrode and the gate insulating layer; and a protection layer, provided on the source and drain electrodes, the active layer, the pixel electrode and the gate insulating layer, and having a via hole provided on the pixel electrode. The active layer and the conductive structure provided thereon are formed in a same patterning process by using a half-tone or gray-tone mask.

According to one or more embodiments of the disclosure, since the active layer and the source and drain electrodes provided thereon are formed in a same patterning process by using a half-tone or gray-tone mask, the LTPS-TFT array substrate can be obtained by five patterning processes using five masks totally. Thus, compared with the conventional technology, the manufacture process of the LTPS-TFT array substrate can be simplified, the production time of the LTPS-TFT array substrate can be shortened, the manufacture cost of the LTPS-TFT array substrate can be reduced and the quality of the LTPS-TFT array substrate can be improved.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

Hereinafter, the embodiments of the disclosure will be described in detail with reference to the accompanying drawings so that the objects, technical solutions and advantages of the embodiments of the disclosure will become more apparent. It should be noted that the embodiments described below merely are a portion of but not all of the embodiments of the disclosure, and thus various modifications, combinations and alterations may be made on basis of the described embodiments without departing from the spirit and scope of the disclosure.

Basically, according to the embodiments of the disclosure, an active layer and source and drain electrodes are formed in a same patterning process with a half-tone or gray-tone mask for example to decrease the number of employed masks and improve the alignment precision between the active layer and the source and drain electrodes.

The right region (portion) in FIGS. 2-9 and 13-17 is the peripheral region of the LTPS-TFT array substrate, and the left region (portion) in these figures is the pixel region of the LTPS-TFT array substrate. Nevertheless, it should be noted that: the right region and the left region in these figures may be not along a same cross-sectional plane of the array substrate; they are drawn in the same cross-sectional view plane in these figures for the purpose of clearly showing the states of the two regions during the manufacture process of the LTPS-TFT array substrate.

First Embodiment

In this embodiment, the LTPS-TFT has a top-gate structure, in which the gate electrode of a TFT is provided above the active layer of the TFT.

Example 1

Figure 2:
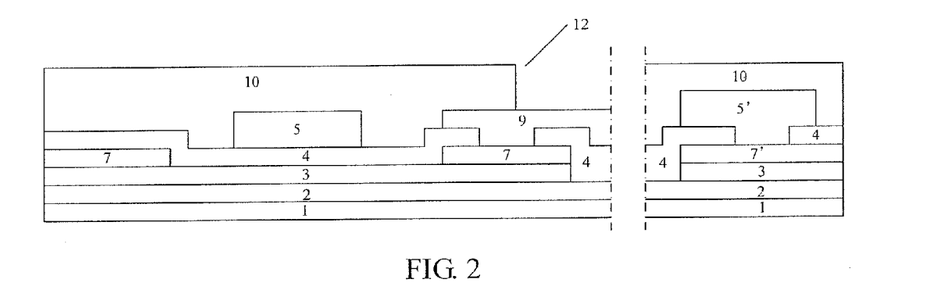
FIG. 2 is a structural schematic view showing an LTPS-TFT in a first example according to a first embodiment of the disclosure.

As shown in FIG. 2, the LTPS-TFT array substrate in the first example comprises: a base substrate 1 and an active layer 3, source and drain electrodes 7, a gate insulating layer 4, a gate electrode 5, a pixel electrode 9 and a protection layer 10, which are formed on the base substrate 1.

The active layer 3 is provided on the base substrate 1; the source and drain electrodes 7 are provided on the active layer 3; the gate insulating layer 4 is provided on the active layer 3, the source and drain electrodes 7 and the base substrate 1; the gate electrode 5 is provided on the gate insulating layer 4; the pixel electrode 9 is provided on the gate insulating layer 4 and the source and drain electrodes 7; and the protection layer 10 is provided on the gate insulating layer 4, the gate electrode 5 and a portion of the pixel electrode 9.

The active layer 3 and the source and drain electrodes 7 are formed in a same patterning process with a gray-tone or half-tone mask.

Moreover, the LTPS-TFT array substrate may further comprise a buffer layer 2, provided on the base substrate 1 and below the active layer 3 and the gate insulating layer 4.

As shown in the right region of FIG. 2, that is, on the right side of the dashed line, the LTPS-TFT array substrate has a peripheral region. The peripheral region comprises: the base substrate 1, the active layer 3, a test line in data-line-metal layer 7', the gate insulating layer 4, a test line in gate-metal-layer 5' and the protection layer 10. The active layer 3 and the test line in data-line-metal layer 7' in the peripheral region are formed in a same patterning process with a gray-tone or half-tone mask along with the active layer 3 and the source and drain electrodes 7 in the pixel region. As shown in FIG. 2, the test line in data-line-metal layer 7' and the test line in gate-metal-layer 5' contact each other. In some cases, in a certain region of the peripheral region, for example in the region that two test lines in gate-metal-layer intersect with each other, it may be required that the test line in gate-metal-layer and the test line in data-line-metal layer connect with each other to form a current path.

Figure 3:
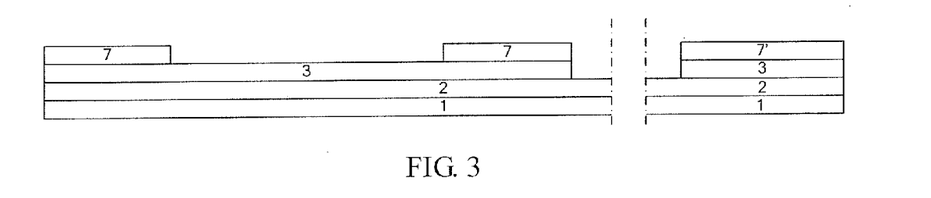
FIG. 3 is a view showing forming an active layer, source and drain electrodes and a test line in data-line-metal layer by using a first mask in the first example according to the first embodiment of the disclosure.

A manufacturing method of the LTPS-TFT array substrate in the first example may comprise the following steps:

Step 101 of sequentially depositing a buffer layer 2 and an a-Si layer on a base substrate 1, crystallizing the a-Si layer into a p-Si layer by a crystallizing method; doping the p-Si layer with a first dopant depending on the type of a channel of the TFT to be formed, depositing a data-line-metal layer on the base substrate and performing a patterning process on the data-line-metal layer and the p-Si layer by using a half-tone or gray-tone mask to obtain an active layer 3, source and drain electrodes 7 and a test line in data-line-metal layer 7' as shown in FIG. 3.

Here, the half-tone or gray-tone mask is referred to as the first mask. By using the half-tone or gray-tone mask, the active layer 3 and the source and drain electrodes 7 are formed simultaneously, the source and drain electrodes 7 are provided on the active layer 3, and thus the source and drain electrodes 7 can connect with the active layer 3 directly and the process for forming a via hole for connecting the source and drain electrodes with the active layer in the conventional technology can be omitted. In addition, since the active layer 3 and the source and drain electrodes 7 are formed simultaneously, the alignment precision between the source and drain electrodes 7 and the active layer 3 can be improved, and the quality of the LTPS-TFT array substrate can be improved.

Alternatively, the buffer layer 2 may be omitted, that is, the a-Si is formed on the base substrate 1 without a buffer layer.

For example, the crystallizing method employed in this step may be an excimer laser annealing (ELA) method, a solid-phase crystallization (SPC) method or the like.

The method employing a half-tone or gray-tone mask to perform patterning process is a conventional technology, the details thereof is omitted here for simplicity.

Figure 4:
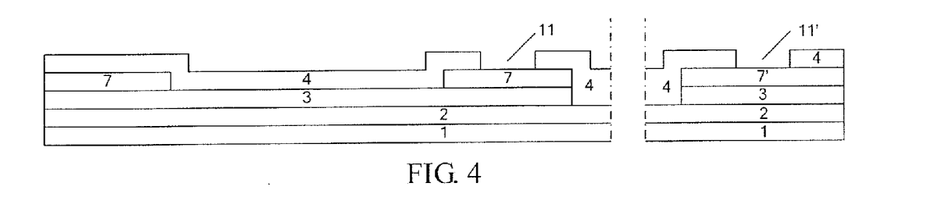
FIG. 4 is a view showing forming a gate insulating layer via hole by using a second mask in the first example according to the first embodiment of the disclosure.

Step 102 of depositing a gate insulating layer 4 on the base substrate 1 after Step 101, forming a first gate insulating layer contact hole 11 at the region where one of the source and drain electrodes 7 is to connect with a pixel electrode and forming a second gate insulating layer contact hole 11' at the region where the test line in data-line-metal layer 7' is to connect with a test line in gate-metal-layer 5' by performing a patterning process on the gate insulating layer 4 with a contact hole mask as shown in FIG. 4, and then doping the channel region of the TFT with a second dopant, the type of which is opposite to that of the first dopant, so as to form a P-N junction between the channel region and the source-drain regions to realize metal oxide semiconductor (MOS) switching structure.

Here, the contact hole mask is referred to as the second mask.

Figure 5:
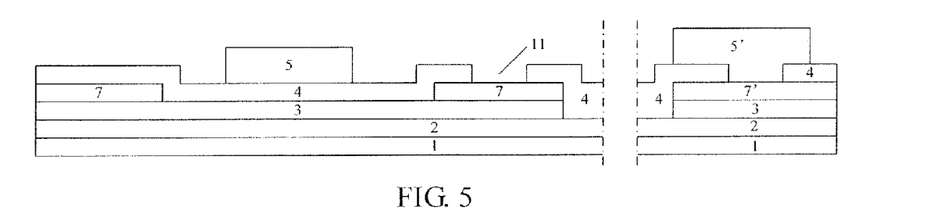
FIG. 5 is a view showing forming a gate electrode and a test line in gate-metal-layer by using a third mask in the first example according to the first embodiment of the disclosure.

Step 103 of depositing a gate-metal-layer on the base substrate 1 after Step 102, and performing a patterning process on the gate-metal-layer by using a gate mask to form a gate electrode 5 and a test line in gate-metal-layer 5'.

The test line in gate-metal-layer 5' is provided at the second gate insulating layer contact hole 11' and on the gate insulating layer 4 around the second gate insulating layer contact hole 11'. Since the test line in gate-metal-layer 5' and the test line in data-line-metal layer 7' contact with each other as shown in FIG. 5, they can electrically communicate with each other for performing a test process.

Here, the gate electrode mask is referred to as the third mask.

Figure 6:
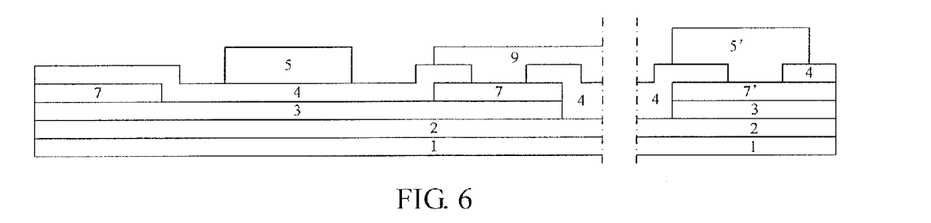
FIG. 6 is a view showing forming a pixel electrode by using a fourth mask in the first example according to the first embodiment of the disclosure.

Step 104 of depositing a transparent conductive layer on the base substrate 1 after Step 103, and performing a patterning process on the transparent conductive layer by using a pixel electrode mask to obtain a pixel electrode 9.

The pixel electrode 9 is provided on the gate insulating layer 4 around the first gate insulating layer contact hole 11, and electrically connect with one of the source and drain electrodes 7 through the first gate insulating layer contact hole 11, as shown in FIG. 6.

The transparent conductive layer may be made of indium tin oxide (ITO), indium zinc oxide (IZO), or the like.

Here, the pixel electrode mask is referred to as the fourth mask. The method may further include the following step, if necessary.

Step 105 of depositing a protection layer 10 on the base substrate 1 after Step 104 and performing a patterning process on the protection layer 10 by using a protection layer mask to form a protection layer via hole 12 at the region where the pixel electrode 9 is required to be exposed, if necessary. In this case, the pixel electrode 9 may act as an anode or cathode of an organic light-emitting diode (OLED) to directly contact the OLED.

The protection layer 10 is used to protect the exposed gate electrode 5, the test line in gate-metal-layer 5' and a gate pad line (not shown in the cross-sectional view). In addition, the protection layer 10 is further used to prevent the OLED from being damaged by the irregular edge of the ITO layer. The protection layer 10 may be made of an organic insulating material such as resin or an inorganic insulating material.

Here, the protection layer mask is referred to as the fifth mask.

Example 2

Figure 7:
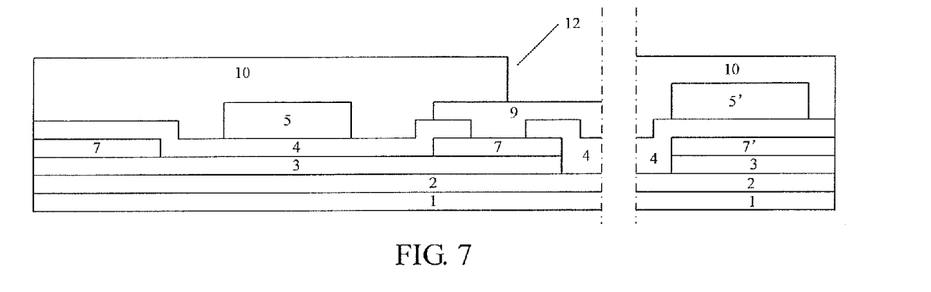
FIG. 7 is a structural schematic view showing an LTPS-TFT array substrate in a second example according to the first embodiment of the disclosure.

As shown in FIG. 7, the LTPS-TFT array substrate in Example 2 differs from the LTPS-TFT array substrate in Example 1 in that: the test line in gate-metal-layer 5' is merely provided on the gate insulating layer 4 and the test line in gate-metal-layer 5' does not contact the test line in data-line-metal layer 7', because it is not required that the test line in gate-metal-layer 5' and the test line in data-line-metal layer 7' are electrically connected with each other in this example.

The manufacture process of the LTPS-TFT array substrate in Example 2 differs from that in example 1 in that: in Step 102, only the first gate insulating layer contact hole 11 is formed at the region where one of the source and drain electrodes 7 is required to contact the pixel electrode 9, and the second gate insulating layer contact hole 11' for connecting the test line in data-line-metal layer 7' and the test line in gate-metal-layer 5' is not aimed.

In addition, the reference number 5' in this example may represent a gate pad line and the reference number 7' may represent data pad line. It should be understood that the gate pad line is not electrically connected with the data pad line.

Example 3

Figure 8:
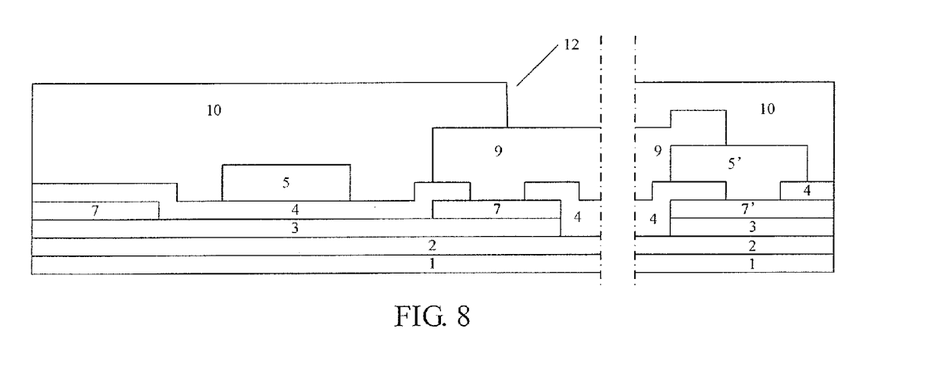
FIG. 8 is a structural schematic view showing an LTPS-TFT array substrate in a third example according to the first embodiment of the disclosure.

As shown in FIG. 8, the LTPS-TFT array substrate in Example 3 differs from the LTPS-TFT array substrate in example 1 in that: the transparent conductive layer 9 is further partially provided on the test line in gate-metal-layer 5'.

The manufacture process of the LTPS-TFT array substrate in example 3 differs from that in example 1 in that: in Step 104, the transparent conductive layer is partially remained on a portion of the test line in gate-metal-layer 5' during the patterning process. In this way, the test line in gate-metal-layer 5' can be protected, and the transparent conductive layer and the test line in gate-metal-layer 5' can be connected in parallel in the circuit to reduce the resistance of the test line in gate-metal-layer 5'.

Example 4

Figure 9:
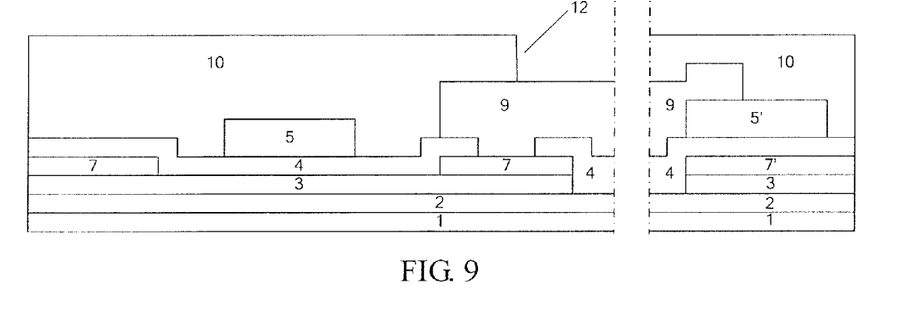
FIG. 9 is a structural schematic view showing an LTPS-TFT array substrate in a fourth example according to the first embodiment of the disclosure.

As shown in FIG. 9, the LTPS-TFT array substrate in example 4 differs from that in example 3 in that: the test line in gate-metal-layer 5' is merely provided on the gate insulating layer 4 and the test line in gate-metal-layer 5' does not contact the test line in data-line-metal layer 7'.

The manufacture process of the LTPS-TFT array substrate in example 4 differs from that in example 3 in that: in Step 102, only the first gate insulating layer contact hole 11 is formed at the region where one of the source and drain electrodes 7 is required to contact the pixel electrode 9, and the second gate insulating layer contact hole 11' for connecting the test line in data-line-metal layer 7' and the test line in gate-metal-layer 5' is not formed.

In this example, the transparent conductive layer 9 may be used to connect the test line in data-line-metal layer 7' with the test line in gate-metal-layer 5' so that the test line in data-line-metal layer 7' and the test line in gate-metal-layer 5' can be electrically connected with each other.

In addition, the reference number 5' in this example may represent a gate pad line and the reference number 7' may represent a data pad line. It should be understood that the gate pad line is not electrically connected with the data pad line.

The LTPS-TFT array substrate according to the first embodiment of the disclosure may be applied to the fields of LCD, OLED and the like.

Second Embodiment

In this embodiment, the LTPS-TFT has a bottom-gate structure, in which the gate electrode of a TFT is provided under the active layer of the TFT.

Figure 10:
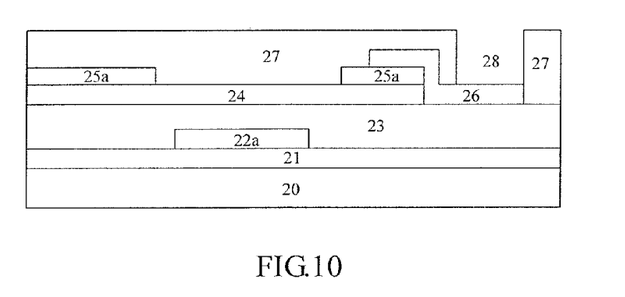
FIG. 10 is a structural schematic view showing an LTPS-TFT array substrate according to a second embodiment of the disclosure.

As shown in FIG. 10, the LTPS-TFT array substrate in this embodiment comprises: a base substrate 20, a buffer layer 21 provided on the base substrate 20, a gate electrode 22a provided on the buffer layer 21, a gate insulating layer 23 provided on the gate electrode 22a and the buffer layer 21, an active layer (p-Si) 24 provided on the gate insulating layer 23 and corresponding to the gate electrode 22a, source and drain electrodes 25a provided on the active layer 24, a pixel electrode 26 provided on the source and drain electrodes 25a and the gate insulating layer 23, and a protection layer 27 provided on the source and drain electrodes 25a, the active layer 24, the pixel electrode 26 and the gate insulating layer 23. The protection layer 27 is formed with a via hole 28 on the pixel electrode 26. By providing the via hole, the transmittance can be improved when the array substrate in this embodiment is applied to an LCD, and the pixel electrode can be directly connected with the organic light emitting layer above the via hole when the array substrate in this embodiment is applied to an OLED.

The active layer 24 and the source and drain electrodes 25a of the LTPS-TFT array substrate in this embodiment are formed in a same patterning process by using a mask. This mask may be a gray tone mask or a half tone mask.

Figure 11:
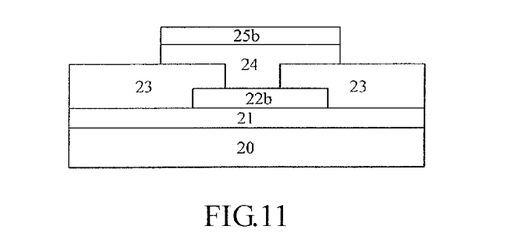
FIG. 11 is a view showing a connection manner of a test line in gate-metal-layer and a test line in data-line-metal layer in the LTPS-TFT array substrate according to the second embodiment of the disclosure.
Figure 12:
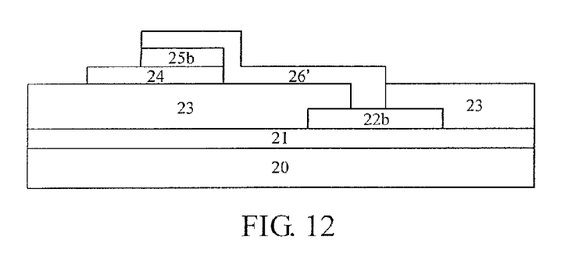
FIG. 12 is a view showing another connection manner of a test line in gate-metal-layer and a test line in data-line-metal layer in the LTPS-TFT array substrate according to the second embodiment of the disclosure.
Figure 13:
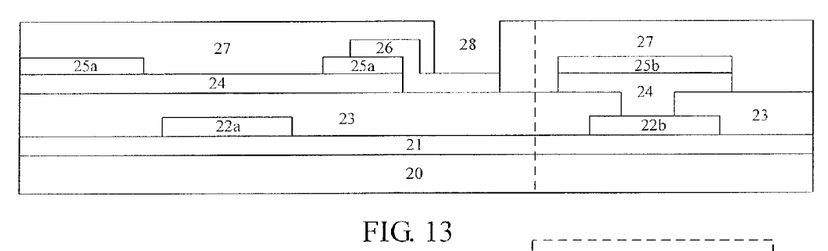
FIG. 13 is a structural schematic view showing the LTPS-TFT array substrate according to the second embodiment of the disclosure, in which a peripheral region of the LTPS-TFT array substrate is shown as well.

In addition, the LTPS-TFT array substrate in this embodiment may further comprise a test line in gate-metal-layer and a test line in data-line-metal layer for performing tests on the TFT. In this case, a contact hole may be formed in the gate insulating layer so that the test line in gate-metal-layer and the test line in data-line-metal layer can bridged (connected) with each other. In some examples, in a certain region of the peripheral region (for example in the region that two test lines in gate-metal-layer intersect but be required to insulate with each other), it may be required that the test line in gate-metal-layer and the test line in data-line-metal layer are connected with each other to form a current path. As shown in FIG. 11 and FIG. 12, the test line in gate-metal-layer 22b and the test line in data-line-metal layer 25b of the LTPS-TFT array substrate in this embodiment may be connected with each other by two optional connection manners. In the first connection manner, the test line in gate-metal-layer 22b and the test line in data-line-metal layer 25b are connected with each other through the active layer 24 in a contact hole (as shown in FIG. 11). For example, when power is supplied to the test line in data-line-metal layer 25b which contacts the active layer, the low temperature poly-silicon in the active layer 24 can be changed from a semiconductor into a conductor, and thus the test line in gate-metal-layer 22b and the test line in data-line-metal layer 25b can be connected with each other through the active layer. In the second connection manner, the test line in gate-metal-layer 22b and the test line in data-line-metal layer 25b are connected with each other through the pixel electrode material section 26' in a contact hole (as shown in FIG. 12). In practice, the test line in gate-metal-layer and the test line in data-line-metal layer may be connected with each other by one or both of the above connection manners. FIG. 13 shows the LTPS-TFT array substrate according to the embodiment of the disclosure, in which the test line in gate-metal-layer and the test line in data-line-metal layer are connected with each other in the first connection manner. In addition, the second connection manner or the combination of the above two connection manners may be used to connect the test line in gate-metal-layer with the test line in data-line-metal layer of LTPS-TFT array substrate according to the embodiment, and the details are omitted here for simplicity.

In addition, the buffer layer 21 may be omitted in some examples, and the gate electrode 22a and the gate insulating layer 23 can be directly provided on the base substrate 20, which can reduce tact time.

Figure 14:
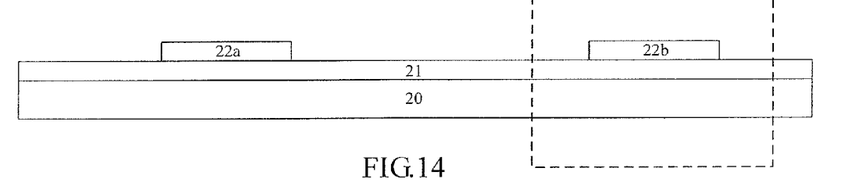
FIG. 14 is a view showing forming a gate electrode and a test line in gate-metal-layer by using a first mask according to the second embodiment of the disclosure.

Hereinafter, the manufacturing method of the LTPS-TFT array substrate according to this embodiment will be described in detail. For example, the manufacturing method of the LTPS-TFT array substrate shown in FIG. 13 may comprise the following steps:

Step 1 of sequentially depositing a buffer layer 21 and a gate-metal-layer on a base substrate 20, performing a patterning process by using a first mask to form a gate electrode 22a, a gate line (not shown in a cross-sectional view) and a test line in gate-metal-layer 22b. FIG. 14 is the cross-sectional view showing formation of the gate electrode and the test line in gate-metal-layer by using the first mask according this embodiment.

In this step, the buffer layer 21 may be omitted, and thus the gate-metal-layer can be directly deposited on the base substrate 20.

Figure 15:
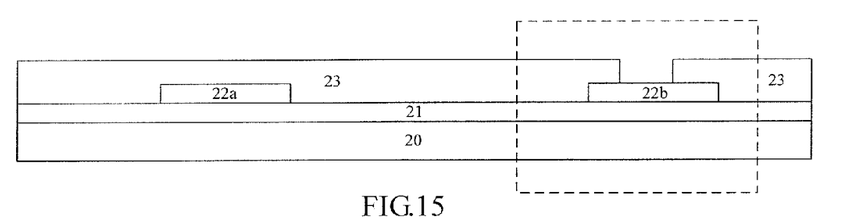
FIG. 15 is a view showing forming a contact hole in a gate insulating layer by using a second mask according to the second embodiment of the disclosure.

Step 2 of depositing a gate insulating layer 23 on the base substrate 20 after Step 1, and forming a contact hole in the gate insulating layer 23 and above the test line in gate-metal-layer 22b by using a second mask so as to connect the test line in gate-metal-layer with the test line in data-line-metal layer to be formed later. The gate insulating layer 23 is provided on the buffer layer 21 and the gate electrode 22a (in the case where the buffer layer 21 is omitted, it is provided on the base substrate 20 and the gate electrode 22a). FIG. 15 is a view showing forming the contact hole in the gate insulating layer via hole by using the second mask in the second embodiment of the disclosure.

Figure 16:
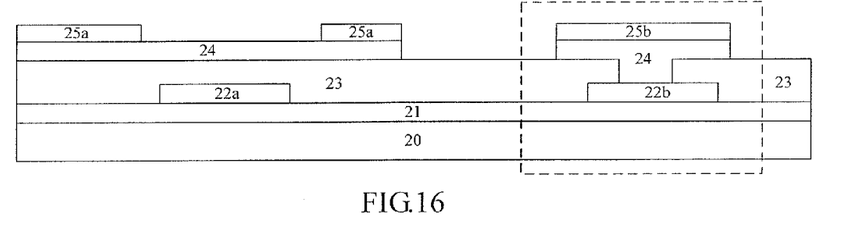
FIG. 16 is a view showing forming an active layer, source and drain electrodes, and a test line in data-line-metal layer by using a third mask according to the second embodiment of the disclosure.

Step 3 of depositing an a-Si layer on the base substrate 20 after Step 2, crystallizing the a-Si layer into a p-Si layer by using a crystallizing method such as ELA method, SPC method or the like, doping the p-Si layer in the regions corresponding to source and drain electrodes by using the first mask as a block, depositing a data-line-metal layer, and performing a patterning process by using a third mask to form an active layer 24, source and drain electrodes 25a, data line (not shown) and a test line in data-line-metal layer 25b. In this step, the p-Si layer in the region corresponding to the gate electrode is not doped. After this step, the test line in gate-metal-layer 22b and the test line in data-line-metal layer 25b are connected with each other through the active layer 24 in the contact hole of the gate insulating layer 23. FIG. 16 is a view showing forming the active layer, the source and drain electrodes, and the test line in data-line-metal layer by using the third mask according to the second embodiment of the disclosure.

In this step, the active layer and the source and drain electrodes can be formed in a same patterning process with a same mask. This mask may be a gray-tone mask or a half-tone mask. In this way, the number of the masks employed in the manufacturing method of the LTPS-TFT array substrate can be reduced and thus the manufacture process can be simplified. In addition, the alignment precision between the source and drain electrodes and the active layer can be improved and thus the properties of the TFT can be improved as well.

Figure 17:
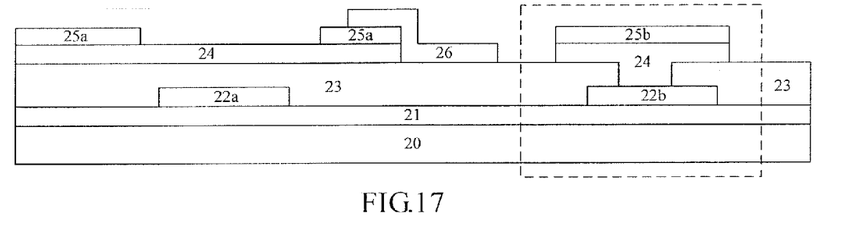
FIG. 17 is a view showing forming a pixel electrode by using a fourth mask according to the second embodiment of the disclosure.

Step 4 of depositing a transparent conductive layer on the base substrate 20 after Step 3, and performing a patterning process by using a fourth mask to form a pixel electrode 26. FIG. 17 is a view showing forming the pixel electrode by using the fourth mask according to the second embodiment of the disclosure.

Step 5 of depositing a protection layer 27 on the base substrate 20 after Step 4, performing a patterning process by using a fifth mask to form a via hole 28 in the protection layer 27 and expose a portion of the pixel electrode 26. At this time, the LTPS-TFT array substrate according to this embodiment is obtained, as shown in FIG. 13.

In this step, the protection layer 27 may be formed of an organic insulating material such as resin or an inorganic insulating material. The protection layer 27 is used as a planarization layer and is used to protect the edge of the pixel electrode. In addition, the protection layer can be also used to protect the source and drain electrodes.

In the LTPS-TFT array substrate according to this embodiment, the test line in gate-metal-layer 22b and the test line in data-line-metal layer 25b are connected with each other by using the first connection manner shown in FIG. 11. In addition, the test line in gate-metal-layer and the test line in data-line-metal layer may be connected with each other by using the second connection manner shown in FIG. 12 or the combination of the first and second connection manners depending on the practical requirements, and the details are omitted here for simplicity. In addition, in the case where it is not required to provide the test line in gate-metal-layer and the test line in data-line-metal layer for testing the TFT, the gate insulating layer is not needed to form with the contact hole. In this case, the second mask is not employed after the gate insulating layer is deposited in Step 2, and finally an LTPS-TFT array substrate as shown in FIG. 10 can be obtained. In addition, depending on the practical requirements, for example it can be optional to form the test line in gate-metal-layer, or the test line in data-line-metal layer, or the test line in gate-metal-layer and the test line in data-line-metal layer without the contact hole in the gate insulating layer, or other manners for testing the properties of the TFT.

It should be noted that: the material, thickness and preparation condition of respective layers in the LTPS-TFT array substrate according to the embodiments of the disclosure may employ those well-known or to be known in the future for those skilled in the art, and the details thereof are omitted here for simplicity.

It should be appreciated that the embodiments described above are intended to illustrate but not limit the present disclosure. Although the present disclosure has been described in detail herein with reference to the preferred embodiments, it should be understood by those skilled in the art that the present disclosure can be modified and some of the technical features can be equivalently substituted without departing from the spirit and scope of the present disclosure.

What is claimed is:

1. A manufacturing method of a low temperature polysilicon thin film transistor (LTPS-TFT) array substrate, comprising:

Step 1 of depositing a gate-metal-layer on a base substrate, and performing a first patterning process by using a first mask to form a gate electrode;

Step 2 of depositing a gate insulating layer on the base substrate after Step 1, the gate insulating layer covering the base substrate and the gate electrode;

Step 3 of sequentially forming a poly-silicon layer and a data-line-metal layer on the base substrate after Step 2, and performing a third patterning process by using a third mask to form an active layer and source and drain electrodes, the active layer being provided on the gate insulating layer and corresponding to the gate electrode, the source and drain electrodes being provided on the active layer; and Step 4 of depositing a transparent conductive layer on the base substrate after Step 3, and performing a fourth patterning process by using a fourth mask to form a pixel electrode, the pixel electrode being provided directly on the drain electrode and the gate insulating layer;

wherein the manufacturing method further comprises:

forming a test line in gate-metal-layer by using the first mask in Step 1;

forming a contact hole in the gate insulating layer by using a second mask in Step 2; and forming a test line in data-line-metal layer by using the third mask in Step 3, the active layer formed in Step 3 filling in the contact hole so that the test line in gate-metal-layer and the test line in data-line-metal layer are capable of being connected with each other.

2. The manufacturing method according to claim 1, further comprising:
  Step 5 of depositing a protection layer on the base substrate after Step 4, and forming a via hole in the protection layer by using a fifth mask to expose the pixel electrode.

3. The manufacturing method according to claim 1, further comprising:
  forming a test line in gate-metal-layer by using the first mask in Step 1;
  forming a contact hole in the gate insulating layer by using a second mask in Step 2;
  forming a test line in data-line-metal layer by using the third mask in Step 3; and
  filling the contact hole with the transparent conductive layer in Step 4 so that the test line in gate-metal-layer and the test line in data-line-metal layer are connected with each other.

4. The manufacturing method according to claim 1, wherein the third mask is a half-tone or gray-tone mask.

5. The manufacturing method according to claim 1, further comprising: prior to Step 1, forming a buffer layer on the base substrate.

6. The manufacturing method according to claim 1, wherein forming the poly-silicon layer in Step 3 comprises:
  depositing an amorphous silicon layer on the base substrate, and
  crystallizing the amorphous silicon layer into the poly-silicon layer by using a crystallizing method.

* * * * *